United States Patent [19]

Le Van Suu

[11] Patent Number: 5,845,275
[45] Date of Patent: Dec. 1, 1998

[54] CURRENT MEASUREMENT CIRCUIT

[75] Inventor: Maurice Le Van Suu, Romainville, France

[73] Assignee: SGS-Thomson Microelectronics S.A., Saint Genis, France

[21] Appl. No.: 780,430

[22] Filed: Jan. 7, 1997

[30] Foreign Application Priority Data

Jan. 11, 1996 [FR] France ................................ 96 00402

[51] Int. Cl.$^6$ .............................. G06G 7/00; G01R 19/00
[52] U.S. Cl. ................. 706/1; 706/52; 706/900; 324/76.11; 324/132
[58] Field of Search .................. 395/3, 61, 900; 323/313, 312; 706/1, 52, 900; 324/132, 76.11

[56] References Cited

U.S. PATENT DOCUMENTS

| | | | |
|---|---|---|---|
| 4,553,084 | 11/1985 | Wrathall | 323/316 |
| 4,599,554 | 7/1986 | Jaycox et al. | 323/317 |
| 4,827,207 | 5/1989 | Chieli | 323/316 |

FOREIGN PATENT DOCUMENTS

A-0 581 993  2/1994  European Pat. Off. ......... H02H 5/10

OTHER PUBLICATIONS

French Search Report from French Patent Application No. 96 00402, filed Jan. 11, 1996.

Simoes, M. Godoy et al. "Application of Fuzzy Logic in the Estimation of Power Electronic Waveforms," Industry Applications Society, 1993 Annual Meeting, pp. 853–861.

Wang, Li–Xin. "Fuzzy Systems are Universal Approximators," Fuzzy Systems, Int'l. Conference 1992, pp. 1163–1170.

*Primary Examiner*—Allen R. MacDonald
*Assistant Examiner*—Jason W. Rhodes
*Attorney, Agent, or Firm*—Wolf, Greenfield & Sacks, P.C.

[57] ABSTRACT

A circuit for the measurement of current in a load includes a non-linear element for transforming a current into a voltage and includes a fuzzy logic processor to process a measurement of the voltage and provide an information element representing the current. The device permits the precise use of semi-conductor or other components for the measurement of current in making a linear approximation of the current-voltage characteristics of the semi-conductors used by using triangular type membership functions. The linear approximation may also be combined with a Gaussian interpolation.

25 Claims, 5 Drawing Sheets

CURRENT MEASUREMENT CIRCUIT

BACKGROUND OF THE INVENTION

1. Field of the Invention

The invention relates to a current measurement circuit. This circuit may be used in systems requiring a measurement of current. Its use is especially advantageous in negative feedback loops for the control of motors, electronic circuit-breakers or power limiter devices that need to work with precise values.

2. Discussion of the Related Art

There are several circuits known to those skilled in the art as regards the measurement of current. Many of these known circuits have the particular feature of using a current/voltage converter to be able to process the information on current in the simplest possible way. The element most commonly used for such conversion is a shunt resistor. A resistor of this kind is inserted into the circuits so as to carry the current that is to be measured. This resistor must have dimensions so as to set up the minimum disturbance in the circuit into which it is inserted. A first problem arises out of the choice of this resistor which must have a resistance of a value that is high enough to carry out an accurate measurement and low enough so as not to disturb the circuit. Furthermore, a certain degree of precision is required for this resistor, with an error that is generally smaller than 1%. The resistors available in the market offer a great deal of choice. However, the resistor that is sought does not yet exist or else it is costly.

For example, for an electronic circuit-breaker for a computer card, the supply voltage may vary from 4.7 V to 5.3 V. At 4.5 V, the card no longer works normally and it is sought to limit the consumption of the card to 3 A. It is possible to have a drop in voltage of 0.2 V for the circuit-breaker. This drop in voltage includes the drop in the resistor and the drop in the transistor of the circuit-breaker. It is therefore necessary to choose a resistor with a value of about 0.025 ohms with an error of less than 1%. A resistor of this kind is generally used for higher-powered assemblies. The resistor chosen is an oversized resistor that is relatively costly.

For uses entailing high current values, the drop in voltage permitted is far greater. For a DC motor control, there is a current of 100 A to be measured with a drop of less than 2 V. Here again, the resistor used is one that is capable of dissipating 200 W while at the same time being precise in its value, and the cost of this resistor will be relatively high.

Other less expensive assemblies are also used. These assemblies use non-linear components such as semiconductors or current transformers. However, the use of such components leads to a greater error rate generally due to variations in the components or to their characteristic curves. Indeed, for the semiconductors, the different values given may have variations in the range of 20% (for example a diode resistor may be given as ranging from 0.4 to 0.5 ohms in boundary values). However, it is possible to make these assemblies more precise by using circuits that compensate for the variation of the components. These circuits require an amount of adjustment time that is costly.

SUMMARY OF THE INVENTION

An aim of the invention is to obtain a current measurement circuit with a precision better than that of the components by overcoming the drawbacks of the above-mentioned assemblies. The novelty of the invention lies in the use of a fuzzy logic processor with a semiconductor type non-linear element.

An object of the invention is a circuit for the measurement of current in a load, said circuit comprising a non-linear element for transforming a current into a voltage, said circuit comprising a fuzzy logic processor to process a measurement of said voltage and provide an information element representing the current.

The lack of precision of the non-linear element is in fact corrected by the fuzzy logic processor that carries out a linear approximation of a characteristic curve of current/voltage transfer of the non-linear element. The use of the fuzzy logic processor enables the setting of the circuit by a learning process in a speedy and therefore inexpensive process, by storing of the real voltage thresholds corresponding to thresholds of triangular-type membership functions. The fact of storing real voltage thresholds in a non-volatile memory enables the precise correction of all the variations that may be due to the non-linear element. One improvement seeks to use Gaussian type membership functions.

The invention proposes the use of different semiconductors as a non-linear element for they undergo little drift in time. Thus, the non-linear element may include diodes, MOS or bipolar transistors, thyristors or triacs. The use of an active element enables the performance of the measurement of the current on an element already existing in the circuit and consequently enables the elimination of voltage drops due to the addition of a resistive probe.

BRIEF DESCRIPTION OF THE DRAWINGS

The invention will be understood more clearly and other advantages shall appear from the following description, made with reference to the appended drawings, of which.

DETAILED DESCRIPTION

Before describing the different embodiments of the invention, it may be useful to recall the operation of a fuzzy logic circuit. A fuzzy logic circuit is an element that makes decisions as a function of one or more inputs (to carry out a measurement of current, only one input is used). For the invention, the inputs used are of the analog type. For each input variable, there exist several membership functions used to determine the proximity of the input levels with respect to the different thresholds. The different thresholds as well as the membership functions are programmable. The input variables are of an analog type and may range from +V to −V, V being the supply voltage of the fuzzy logic processor.

For each membership function, there is at least one rule that sets up a decision. Since an input value may belong to several membership functions, the decision that is given is equivalent to a mean of the possible decisions weighted by the membership functions. The rules and the decisions are also programmable.

In the invention, the use of a fuzzy logic processor amounts in fact to carrying out a linear approximation of the input variable or variables. The precision will actually depend on the membership functions associated with each input. For the calibration of a fuzzy logic device, it is enough to place the inputs at different levels and record these values as being thresholds to be associated with the membership function. In other words, for a measurement of current using a non-linear element, the characteristic curve of the non-linear element will determine the number of membership functions and their distribution with respect to said characteristic curve. The setting up of the rules will be done as a function of certain values corresponding to particular points of the membership function. The thresholds of the membership functions will be recorded in a learning stage that is carried out after the mounting of the machine. The fact of having recourse to a learning method makes it possible to eliminate the different variations in characteristics due to the non-linear elements. This amounts to compensating for all the variations of the characteristics of the non-linear elements.

The learning process does not require the presence of an operator. It may be done on an automated test bed. The test bed will replace the load of the circuit and positions different current values that have to correspond to certain thresholds. When the current is truly stable, the test bed generates a threshold recording signal.

A method of this kind may also be used to recalibrate a device that has undergone certain variations and characteristics due to the aging of the components.

Figures 1, 2:
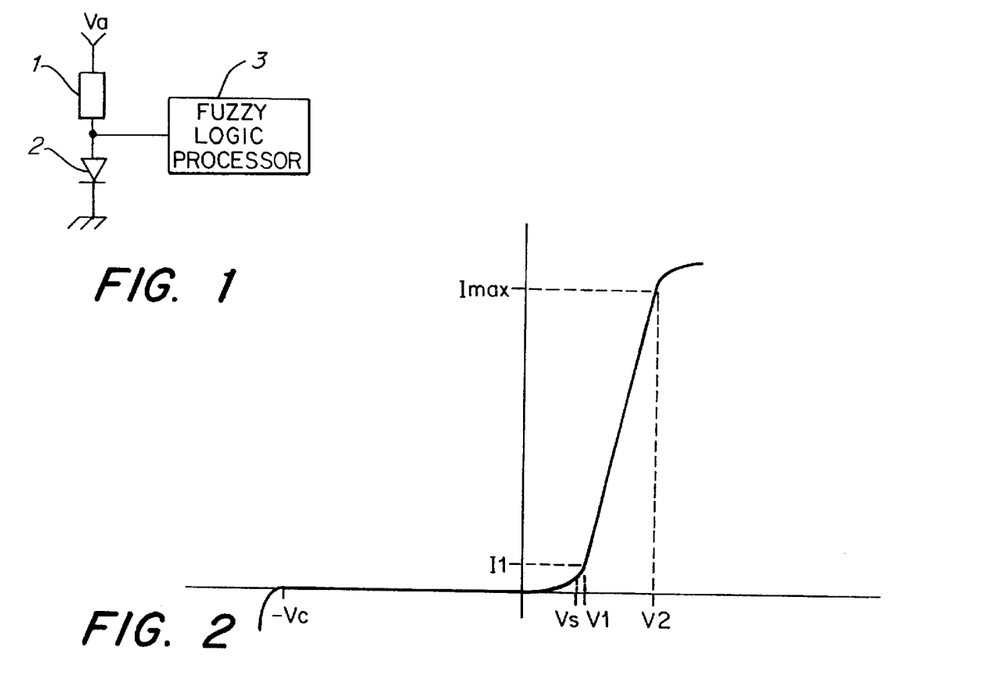
FIG. 1 shows an embodiment of the invention using a diode.
FIG. 2 shows the characteristic curve of a diode.

A detailed example for the use of the fuzzy logic processor is that of an embodiment of the invention using a diode as shown in FIG. 1. A load 1 has a first terminal connected to a supply voltage Va and a second terminal connected to the anode of a diode 2. The cathode of this diode 2 is connected to the ground. The voltage at the terminals of the diode represents current that goes through it, as expressed by the characteristic of this diode. Thus, an input of the fuzzy logic processor 3 is connected to the anode of the diode 2. Those skilled in the art will understand that the load 2 may be of different types and that it is also possible to add on protection elements to the input of the fuzzy logic processor 3.

FIG. 2 shows the characteristic curve of a diode. This characteristic, which is well known in the prior art, can be split up into five fields of operation:
 a first non-linear field for voltages below −Vc (respectively currents below 0 A),
 a second field called a linear field for voltages ranging from −Vc to 0 V (respectively zero currents),
 a third non-linear field for voltages ranging from 0 V to V1 (and currents ranging from 0 A to I1 respectively),
 a fourth non-linear field for voltages ranging from V1 to V2 (and currents ranging from I1 to Imax respectively),
 a fifth non-linear field for voltages greater than V2 (and currents greater than Imax respectively).

The first field corresponds to the disruption of the diode which may be destructive if the diode is not designed for this purpose. In order to avoid being in such a situation, a diode is chosen with a Vc (reverse breakdown voltage given by the manufacturer) in such a way that the situation cannot arise.

The second field corresponds to an OFF diode, the current being an almost zero leakage current.

The third field corresponds to a switching of the diode. An approximation of this field takes the form of an exponential function.

The fourth field corresponds to an ON diode. This field is very close to a straight line and the manufacturer gives the threshold voltage Vs that corresponds to the voltage of the Thevenin model of the diode as well as the resistance of the diode that will give the slope of the straight line. Conventionally, the manufacturer gives the typical and boundary values of these two parameters which, depending on the diodes, correspond to an error of 5 to 20%.

The fifth field corresponds to an excessive dissipation of power in the diode that will lead to destruction of the diode. In general, manufacturers give a maximum value of current Imax with a safety coefficient.

Figure 3:
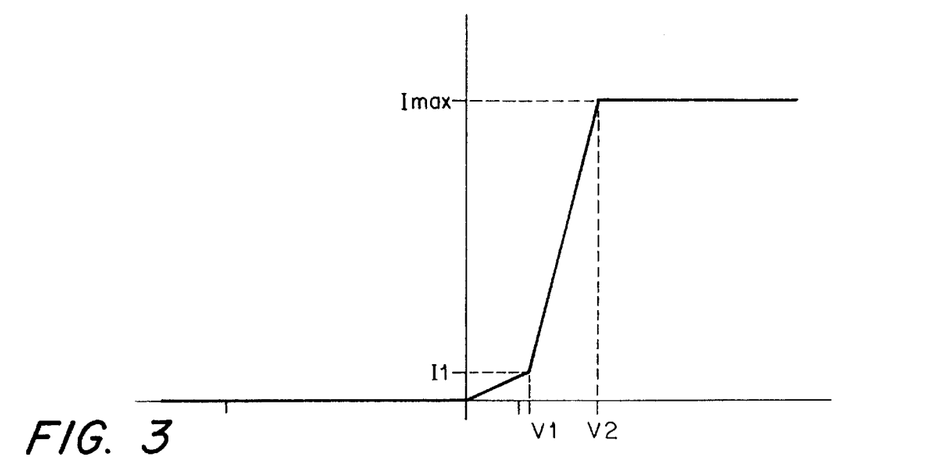
FIG. 3 shows a possible modelling, according to the invention, of the characteristic curve of a diode.

In practice, the diodes are used with voltages of over −Vc and with currents of less than Imax. In this example, it is assumed that the currents with which we are concerned range from 0 A to Imax. Thus, a modelling like that of FIG. 3 is perfectly appropriate for a very precise measurement in the second and fourth fields and a little less precise in the third field. For this purpose, the membership functions 4, 5 and 6 shown in FIG. 4 will be used.

Figure 4:
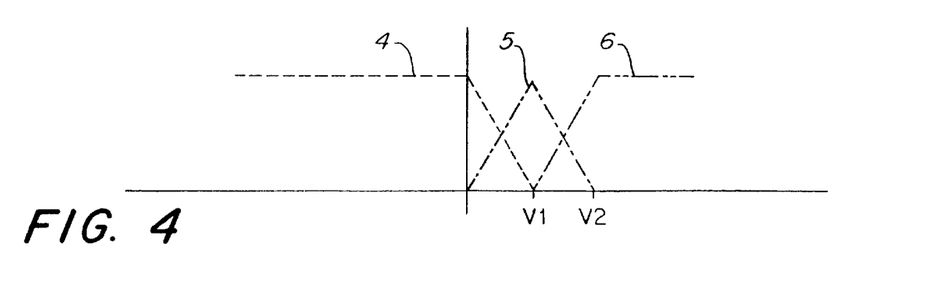
FIG. 4 shows the membership functions associated with the modelling of FIG. 3.

The first membership function 4 is equal to "1" for all the voltages less than or equal to 0 V. It decreases linearly up to "0" for a voltage equal to V1 and is equal to "0" for voltages of over V1. The second membership function 5 is equal to "0" for voltages of less than 0 V or greater than V2, increases linearly from "0" to "1" for voltages ranging from 0 V to V1 and decreases linearly from "1" to "0" for voltages ranging from V1 to V2. The third membership function 6 is equal to "0" for voltages of less than V 1, increases linearly from "0" to "1" for voltages ranging from V1 to V2 and is equal to 1 for voltages higher than V2.

The fuzzy logic processor has three rules, one for each membership function:
 if the measured voltage belongs to the first membership function, then the current is equal to 0 A,
 if the measured voltage belongs to the second membership function, then the current is equal to I1,
 if the measured voltage belongs to the third membership function, then the current is equal to Imax.

In this example, three thresholds have been set. The first threshold corresponding to 0 V is independent of the diode; it will therefore be fixed during the programming of the membership functions and the decision rules. The thresholds V1 and V2 are set on test stands. On the test stand, it is enough to replace the load 1 with a variable load provided with calibration means enabling the setting of the currents I1 and Imax. When each of the currents is well established, the value of the corresponding voltage is recorded in the memory of the fuzzy logic processor.

As a numerical example, it is desired to make a precise measurement of a current varying from 0.1 A to 20 A. The voltage value corresponding to 0.1 A, for example 0.8 V, and the voltage value corresponding to 20 A, for example 2 V, are recorded. A voltage measurement of 1.5 V will belong to the third membership function by 58.3%, to the second membership function by 41.7%, and to the first membership function by 0%. We therefore have the measured current equal to 0.583 * 20+0.417 * 0.1=11.7 A.

If those skilled in the art wish to make a more precise use of the characteristic of the diode in the third field, it is preferable to add thresholds, membership functions and additional decision rules in order to have a better approximation of the curve and hence greater precision.

Figure 5:
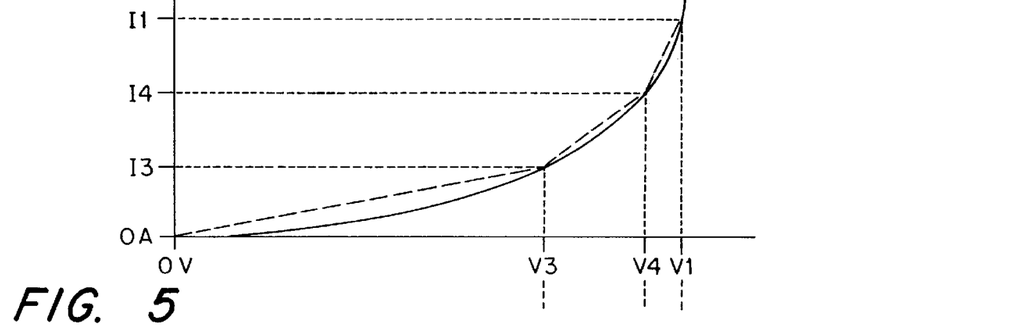
FIG. 5 shows another possibility of modelling of the characteristic curve of a diode according to the invention.
Figure 6:
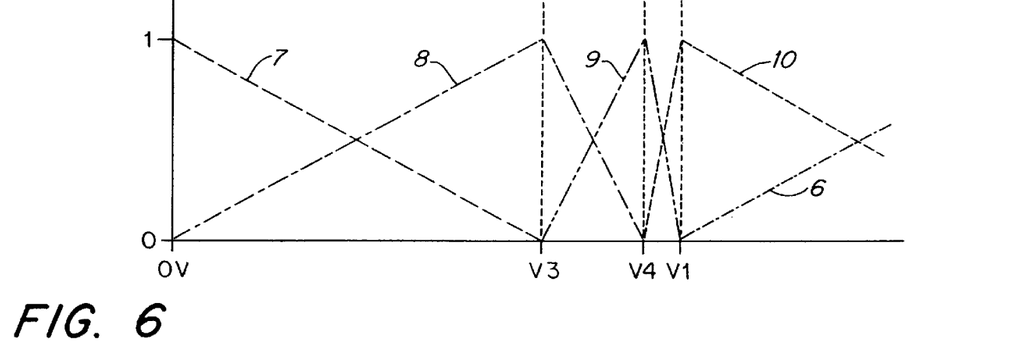
FIG. 6 shows the membership functions associated with the modelling of FIG. 5.

FIG. 5 shows an enlargement of the characteristic curve of the diode in the third field. This enlargement makes it possible to show an approximation of the characteristic curve in the third field. For this purpose, there have been added additional voltage thresholds V3 and V4 to which there respectively correspond the currents I3 and I4. The membership functions associated with this approximation of the characteristic curve of the diode are shown in FIG. 6.

Of the three membership functions defined here above, only the third membership function 6 has been preserved. The first and second membership functions 4 and 5 are replaced by fourth, fifth, sixth and seventh membership functions 7 to 10.

The fourth membership function 7 is equal to "1" for all the voltages lower than or equal to 0 V. It decreases linearly up to "0" for a voltage of 0 V to V3 and is equal to "0" for voltages of over V3. The fifth membership function 8 is equal to "0" for the voltages lower than 0 V or greater than V4. It increases linearly from "0" to "1" for voltages ranging from 0 V to V3, and decreases linearly from "1" to "0" for voltages ranging from V3 to V4. The sixth membership function 9 is equal to "0" for the voltages lower than V3 or greater than V1. It increases linearly from "0" to "1" for voltages of V3 to V4 and decreases linearly from "0" to "1" for voltages of V4 to V1. The seventh membership function 10 is equal to "0" for the voltages lower than V4 or greater than V2. It increases linearly from "0" to "1" for voltages of V4 to V1 and decreases linearly from "1" to "0" for voltages of V1 to V2.

The fuzzy logic processor therefore has five rules, one for each membership function:

if the measured voltage belongs to the third membership function 6, then the current is equal to 1 max, if the measured voltage belongs to the fourth membership function 7, then the current is equal to 0, if the measured voltage belongs to the fifth membership function 8, then the current is equal to I3, if the measured voltage belongs to the sixth membership function 9, then the current is equal to I4, if the measured voltage belongs to the seventh membership function 10, then the current is equal to I1.

The thresholds V1, V2, V3 and V4 are memorized by learning.

It will be noted that it is also possible to add other membership functions to obtain greater precision.

In fuzzy logic theory, the membership functions may have relatively complicated forms. In the invention, there are proposed simple triangular type forms that are very easy to exploit. Indeed, it is enough to carry out simple operations. To obtain the membership percentage, it is enough to carry out three subtractions and one division. This amounts to carrying out the following operations: (Vm−Vsb)/(Vsm−Vsb) for a first percentage and 1−(Vm−Vsb)/(Vsm−Vsb) for the second percentage, Vm being the measured voltage, Vsb being the low threshold of the membership function and Vsm being the threshold corresponding to the maximum of the membership function. Since the divisions are operations that require a fairly substantial amount of time, the values of 1/(Vsm−Vsb) may be recorded during the calibration and the division may be replaced by a multiplication.

For the other embodiments of the invention that follow, those skilled in the art will be capable of separating the different characteristics of the components depending on the precision that they seek just as in the approximations of diode characteristics. The breakdown of the characteristics of the components are not described in detail only in order to reduce the amount of description.

Figure 7:
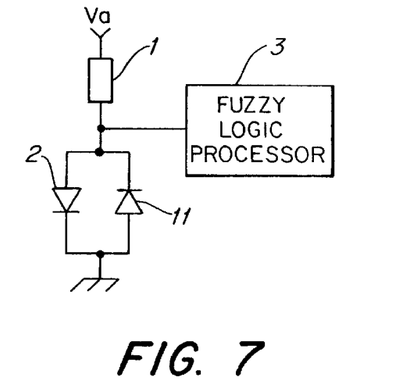
FIG. 7 shows an embodiment of the invention using two diodes.

In FIG. 7, a second diode 11 has been added. This diode 11 is reverse-mounted in parallel to the diode 2. This enables the measurement of current in both directions.

Figure 8:
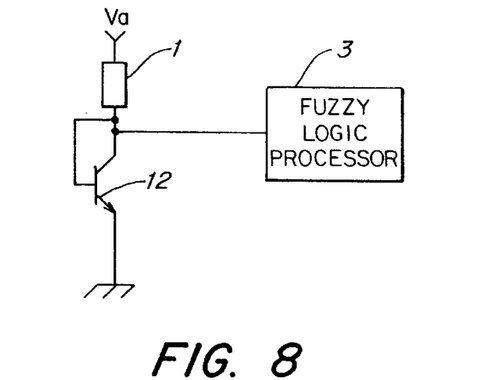
FIGS. 8 to 15 show different embodiments of the invention using bipolar transistors and MOS transistors.
Figure 9:
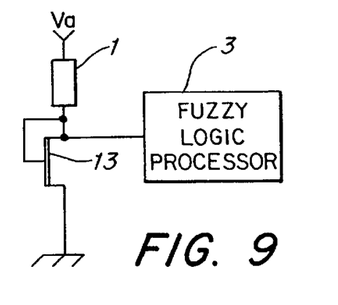

The diode 2 may be replaced by a bipolar transistor 12 or a MOS transistor 13 mounted as a diode as can be seen in FIGS. 8 and 9.

Figure 10:
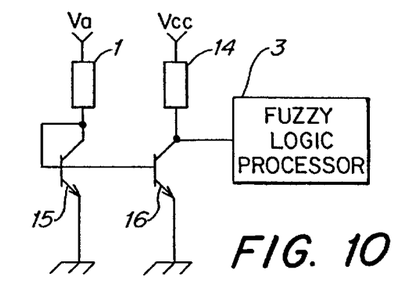

FIGS. 8 and 9 may be improved by the use of a current mirror in order to decouple the input of the fuzzy logic processor from the power supply Va if this voltage is excessively high. Thus, in FIG. 10, a so-called current mirror assembly is used. The second terminal of the load 1 is connected to the collector of a transistor 15 mounted as a diode. The emitter of this transistor 15 is connected to the ground. A second load 14 has a first terminal connected to the supply voltage Vcc of the fuzzy logic processor 3, a second terminal of the second load 14 being connected to the collector of a transistor 16. The transistor 16 has its base connected to the base of the transistor 15, the emitter of the transistor 16 being connected to the ground (the ground is common to both supplies). The fuzzy logic processor measures the collector voltage of the transistor 16. A current mirror is formed with the two transistors 15 and 16 if these two transistors are strictly identical in terms of dimensions (preferably on the same substrate).

Figure 11:
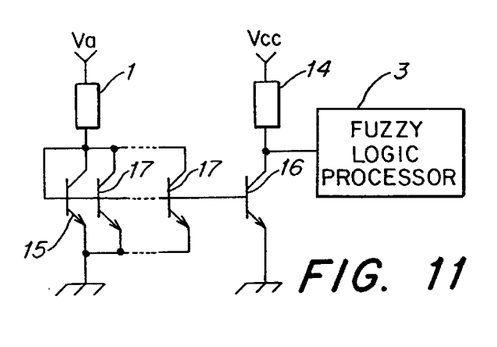

The disadvantage of the current mirror device is that it gives rise to the consumption of considerable current in the second load 14. It is possible to reduce this consumption by adding several transistors 17 parallel-connected with the transistor 15. All these transistors 15, 16 and 17 must have the same dimensions. An assembly of this kind is shown in FIG. 11. It will be preferable to use a matrix of identical transistors using one and the same substrate, where one of the transistors will be used to take current. A device of this kind enables the division of the current in the load 14 by the number of transistors 15 and 17 used. It is also possible to use a transistor 15 that is bigger than the transistor 16, but the precision is lower.

Figure 12:
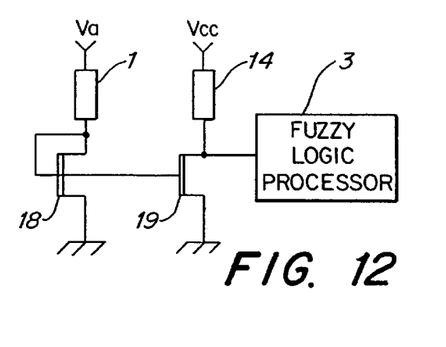
Figure 13:
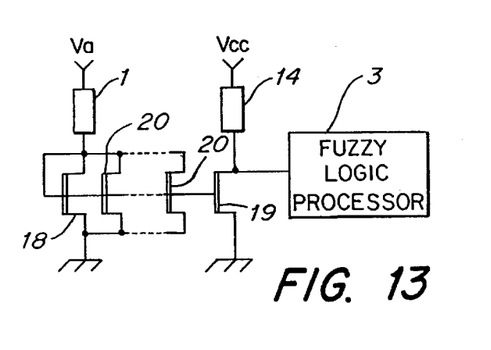

The transposition with the MOS transistors is done automatically by replacing the transistors 15, 16 and 17 by MOS transistors 18, 19 and 20. FIGS. 12 and 13 are equivalent to FIGS. 10 and 11.

Figure 14:
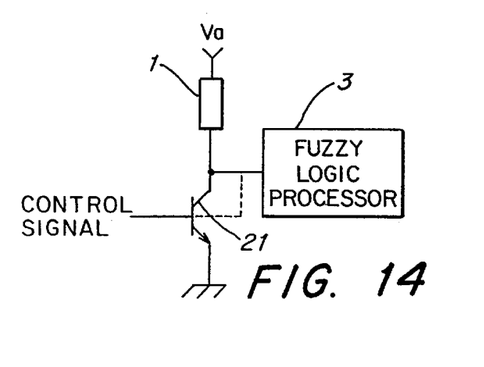
Figure 15:
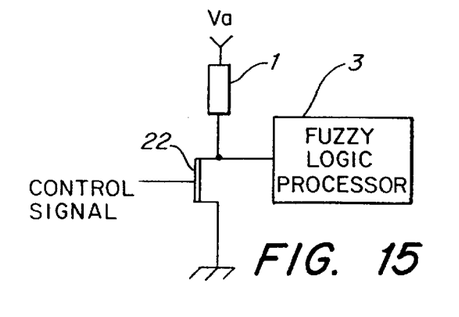

Another valuable feature of the use of a non-linear element to carry out the measurement of current lies in the use of a component for the switching of the load 1 to carry out the measurement. Thus, FIG. 14 shows the load 1 that is switched over by a transistor 21 used as a switch between a supply voltage Va and the ground as a function of a control signal. The voltage measurement carried out by the fuzzy logic processor 3 may be done on the collector of the transistor 21 or on the base of the transistor 21. The choice of the collector or of the base as a measurement point actually depends on the size of the current to be measured. If this current is low, the voltage variations on the base are not great enough to measure the current and it is therefore preferable to make the measurement on the collector. If a MOS transistor 22 such as the one shown in FIG. 15 is used, the voltage measurement is obviously done on the drain.

Figure 16:
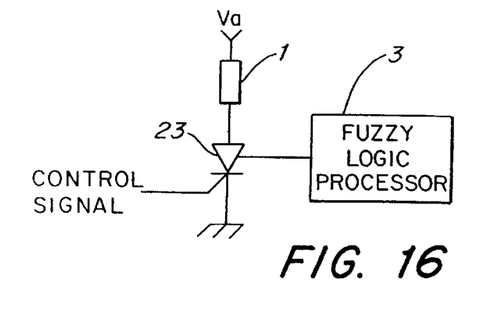
FIG. 16 shows an embodiment of the invention using a thyristor, FIG. 17 gives a schematic view of a thyristor modified according to the invention.

It is also possible to use a thyristor 23 as can be seen in FIG. 16. The second terminal of the load 1 is connected to the anode of the thyristor 23, the cathode of this thyristor 23 being connected to the ground. A control signal is sent to the trigger of the thyristor 23. The voltage measured will preferably be the voltage of the PN junction of the thyristor 23, the N-doped zone of which is connected to the ground.

Figure 17:
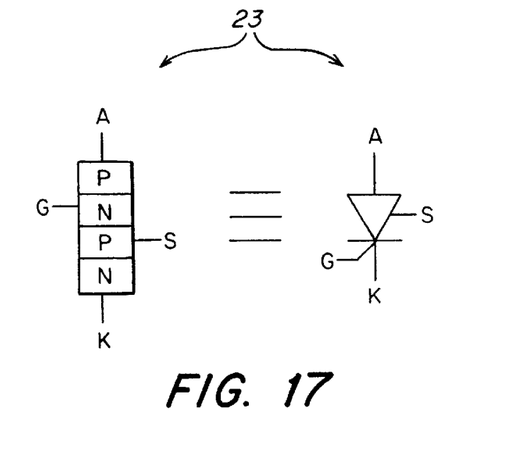

FIG. 17 shows the thyristor 23. To the left there is illustrated a schematic view in section. The four alternately N and P doped layers are represented by rectangles. Conventionally, the layer P taken between the two layers N has no terminal connected to the exterior. It is proposed to make a terminal referenced S in order to be able to take the voltage between S and the cathode referenced K. This amounts to carrying out a measurement at the terminal of a diode. Furthermore, the performance of the measurement on S enables the protection of the input of the fuzzy logic processor 3 against voltages that could be destructive.

Figure 18:
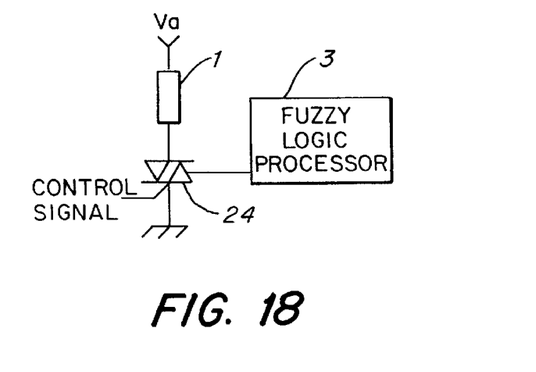
FIG. 18 shows an embodiment of the invention using a triac, FIG. 19 gives a schematic view of a modified triac according to the invention.
Figure 19:
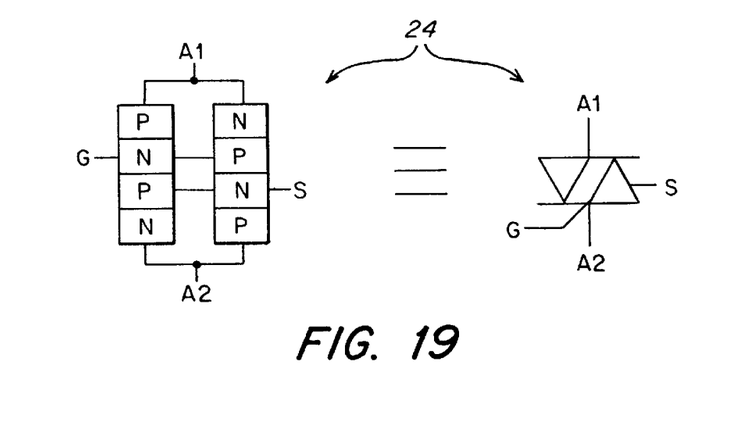

In a manner identical to the thyristor 23, it is also possible to use a triac 24 as can be seen in FIG. 18. Here again, preferably a measurement output on the triac 24 will be resorted to. FIG. 19 shows the semiconductor layers on which the voltage measurement representing the current is performed. Furthermore, the input of the fuzzy logic processor is completely protected for it is connected to a diode assembly of the type shown in FIG. 7.

Figure 20:
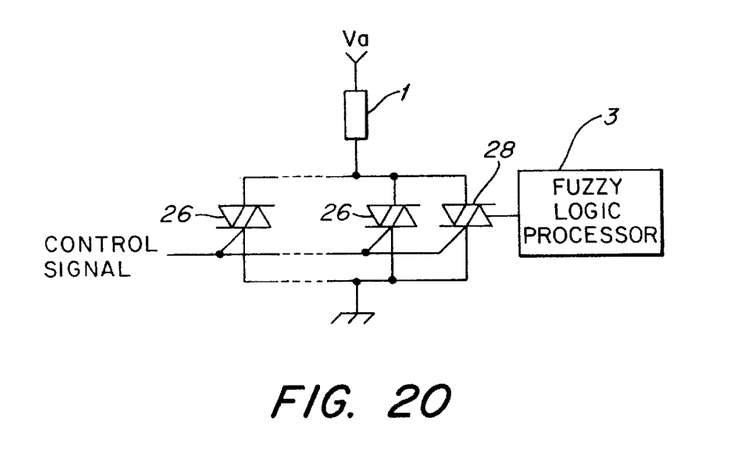
FIGS. 20 and 21 show embodiments using matrices of triacs and matrices of thyristors, FIG. 22 gives a schematic view of a fuzzy logic processor as is necessary in the invention.
Figure 21:
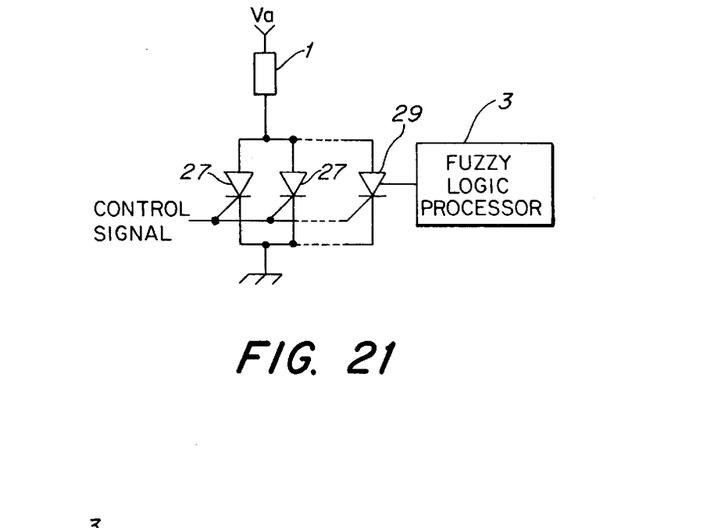

It is also possible to resort to a matrix of triacs 26 or thyristors 27 as can be seen in FIGS. 20 and 21. It is known that if a single large-sized triac 24 (or thyristor 23) is used to switch over a load crossed by a very high current, there is a risk of destruction of the triac 24 (or thyristor 23) during the different switch-over operations. The fact of having recourse to a matrix of smaller-sized triacs 26 (or thyristors 27) limits the risk of destruction by a homogeneous distribution of the current in the different triacs 26 (or thyristors 27). The invention proposes the measurement of the voltage of the terminal S (shown in FIGS. 17 and 19) on only one element 28 (or 29). Indeed, all the triacs 26 and 28 (or thyristors 27 and 29) located on a matrix of the same substrate carry the same current. Furthermore, the thyristors 27 and 29 or triacs 26 and 28 have a lower temperature in a matrix, making the measurement less dependent on temperature.

Those skilled in the art will easily understand that it is possible to use other non-linear elements (whether semiconductor elements or not) to carry out the measurement without in any way thereby departing from the framework of the invention. Furthermore, it is possible to have many variants including additional protective elements designed to prevent the need for destructive voltages at the input of the fuzzy logic processor, and these variants do not go beyond the scope of the invention.

Figure 22:
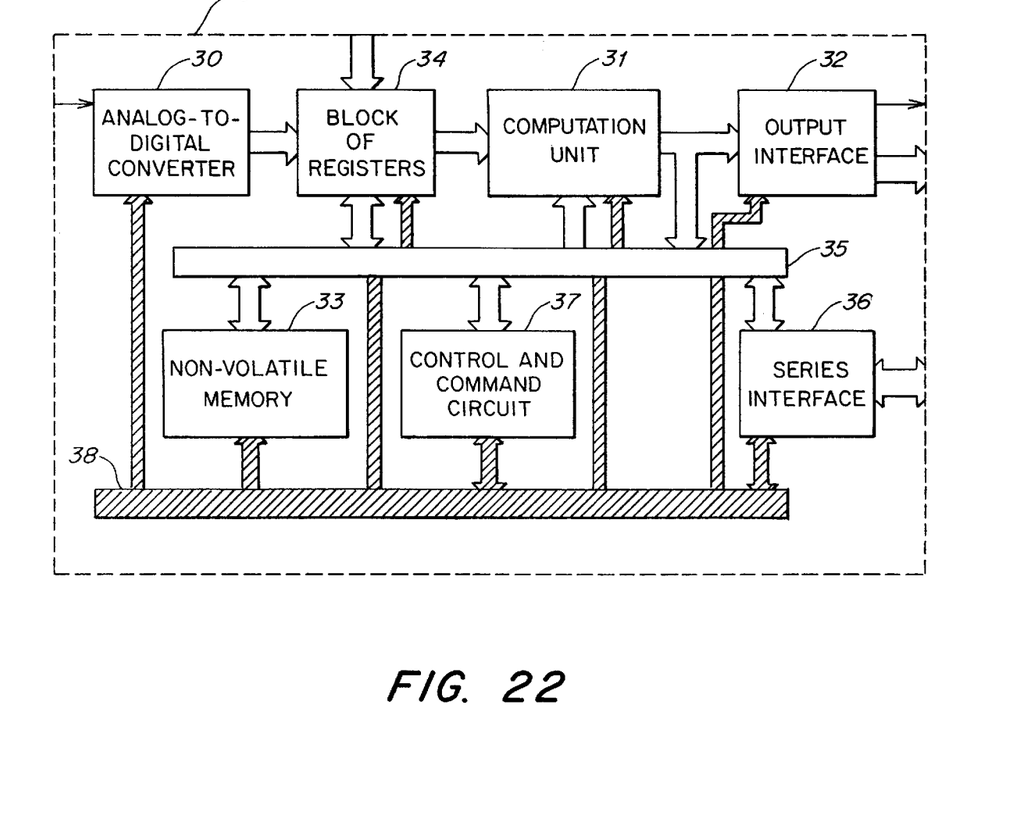

With regard to the fuzzy logic processor 3, preferably a processor of the type shown in FIG. 22 is chosen. This fuzzy logic processor has:

an analog/digital converter 30 having available at least one analog input connected to an input terminal of the processor 3, a data output (for example on 8 bits), command and control signal inputs/outputs, in particular to manage the beginning and end of conversion operations, and the sampling, a computation unit 31 having two data inputs and one data output, command and control inputs/outputs to manage different operations such as comparison, subtraction, addition, multiplication and division operations that are necessary for the computation of triangular type membership functions, an output interface 32 having one data input connected to the output of the computation unit 31, one analog data output and one digital data output both connected to output terminals of the processor 3, and command signal inputs designed to determine the state of the outputs (for example high impedance, storage of the analog output data elements, etc.), a non-volatile memory 33 (for example of the EPROM type) having one data input/output and command inputs, this memory 33 being used to store the different thresholds of the membership functions and also the different decision rules, a block of working registers 34 enabling simultaneous operations for reading/writing of registers and having a data input connected to the data output of the converter 30, a data input connected to a digital data input terminal of the processor 3, a data output connected to the first data input of the computation unit 31, a data input/output connected to a data bus 35 and control inputs (to select the storage or extraction of data elements from one or more of the registers on the basis of the different inputs/outputs of the block of registers 34, the data bus 35 connects the data input/output of the block of registers 34, the second input of the computation unit 31, the output of the computation unit 31 and the data input/output of the non-volatile memory 33, a series interface 36 having one series input/output (according to a conventionally used standard) connected to a terminal of the processor 3, a parallel data input/output connected to the data bus 35, command and control inputs/outputs, a command and control circuit 37 having one data input/output connected to the data bus and command and control inputs/outputs connected to a command bus 38, this command circuit 37 being used to sequence all the operations that occur in the processor, the command bus connects all the inputs and command and/or control inputs/outputs of all the elements of the circuit with the command and control inputs/outputs of the command circuit 37.

The command circuit 37 carries out a sequencing of the processor includes sampling and converting the data elements that enter the converter 30 or directly enter the register block, then in making the different decision rules flow past by ascertaining, at each time, the membership in the membership functions corresponding to these rules. In normal operation, the control circuit 37 therefore alternates an updating of the input parameters and a scanning of the rules. Naturally, a result is given at the end of the scanning of the rules. The control circuit will also see to the transfers of information with the exterior through the serial interface that enables special types of operation of the processor 3, especially the recording of the different parameters.

A fuzzy logic processor of this kind is already commercially distributed by the firm SGS-THOMSON MICRO-ELECTRONICS under the name of W.A.R.P.3.

Furthermore, the existing fuzzy logic processors make available trapezoid or Gaussian type membership functions. Another embodiment of the invention lies in combining the linear approximation explained here above with half-Gaussian forms. The use of Gaussian forms enables a reduction in the number of membership functions needed to follow a curve without increasing the error. This amounts to carrying out a Gaussian interpolation. Those skilled in the art will also understand that other inputs of the fuzzy logic processor may be used for other parameters. Furthermore, the decision of the fuzzy logic processor may be of another type than that corresponding to the value of the current. For example it may be a control signal to switch over the load.

The measurement errors actually depend on the resolution of the analog/digital converter. The resolution is conventionally equal to one least significant bit or ½ of a least significant bit, making the error lower than $½^n$ (n being the number of bits on which the sampling is done) times the deviation in maximum voltage. The linear approximation of the curve also comes into play in the computation of the error. It is possible however to have an error of less than 1% of the maximum deviation to be measured by using an 8-bit converter.

For example, if the invention is used for a control of motors, the fuzzy logic processor may have one input for the measurement of currents, one input for the instructed value of speed, one input for the real speed and, as a function of membership rules and functions of these three inputs, it may determine a decision which is the command of the transistor switching over the motor.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for measuring current in a load, the circuit comprising:
   a non-linear circuit element; and a fuzzy logic processor electrically coupled to the non-linear circuit element, the fuzzy logic processor receiving a voltage value from the non-linear circuit element;
   wherein the fuzzy logic processor converts the voltage value to an information element representing the current in the load using membership functions and decision rules that represent a characteristic curve of the non-linear circuit element.

2. A circuit according to claim 1, wherein the non-linear circuit element is a MOSFET type measurement transistor having a source connected to a ground and a drain connected to an input of the fuzzy logic processor and to a terminal of the load.

3. A circuit according to claim 2, wherein the transistor connected to the load has its drain connected to its gate.

4. A circuit according to claim 2, wherein the transistor connected to the load has its gate connected to a control circuit and wherein said transistor is used as a switch.

5. A circuit according to claim 1, wherein the non-linear circuit element is a MOSFET type measurement transistor having its source connected to the ground and its drain connected to an input of the fuzzy logic processor and to a bias circuit, and wherein an intermediate transistor has its drain connected to the terminal of the load, its source connected to the ground and its gate connected to the gate of the measurement transistor.

6. A circuit according to claim 5 wherein the intermediate transistor is parallel-connected with a plurality of transistors whose dimensions are identical to those of the intermediate transistor.

7. A circuit according to claim 5, wherein the measurement transistor has its dimensions identical to the dimensions of the intermediate transistor.

8. A circuit according to one of claims 2 to 4, wherein:
   the MOSFET transistors are replaced by bipolar transistors;
   the gates are replaced by bases;
   the sources are replaced by emitters; and
   the drains are replaced by collectors.

9. A circuit according to claim 1, wherein the non-linear circuit element is a diode.

10. A circuit according to claim 1, wherein the non-linear circuit element is constituted by two diodes, parallel-connected in reverse to each other.

11. A circuit according to claim 1, wherein the non-linear circuit element is a measurement thyristor whose trigger is connected to a control signal.

12. A circuit according to claim 11, wherein the measurement thyristor is parallel-connected with a plurality of thyristors having identical dimensions.

13. A circuit according to claim 1, wherein the non-linear circuit element is a measurement triac whose trigger is connected to a control signal.

14. A circuit according to claim 13, wherein the measurement triac is parallel-connected with a plurality of triacs having identical dimensions.

15. A circuit according to claim 1, wherein the fuzzy logic processor comprises a non-volatile memory zone and wherein membership functions and decision rules pertaining to the information representing the current are stored in the non-volatile memory.

16. A circuit according to claim 15, wherein the membership functions are of a triangular type.

17. A circuit according to claim 16, wherein the fuzzy logic processor carries out a linear approximation of a current-voltage transfer characteristic of the non-linear element.

18. A circuit according to claim 15, wherein the membership functions are of a Gaussian type.

19. A circuit according to claim 15 wherein the triangular type membership functions are used simultaneously with Gaussian type membership functions.

20. A circuit according to claim 15, wherein voltage thresholds demarcating the membership functions are stored in the non-volatile memory during a calibration of the measurement circuit.

21. A circuit according to claim 15, wherein the decision rules determine an information element representing the current in the load.

22. A circuit according to claim 15, wherein the fuzzy logic processor has several information inputs and wherein the decision rules determine a control signal.

23. A circuit according to claim 1, wherein the non-linear circuit element is a semiconductor.

24. A circuit according to claim 1, wherein the information element represents the instantaneous current.

25. A circuit according to claim 1, wherein the characteristic curve is a current/voltage transfer curve of the non-linear circuit element.

* * * * *

UNITED STATES PATENT AND TRADEMARK OFFICE
CERTIFICATE OF CORRECTION

PATENT NO. : 5,845,275

DATED : December 1, 1998

INVENTOR(S): Maurice Le Van Suu

It is certified that error appears in the above-identified patent and that said Letters Patent is hereby corrected as shown below:

In column 8, line 47, after "processor" please insert --which--.
In column 8, line 56, please change "series" to --serial--.

Signed and Sealed this

Twenty-fifth Day of May, 1999

Q. TODD DICKINSON

Attest:

Attesting Officer

Acting Commissioner of Patents and Trademarks